(12) United States Patent
Ramesh et al.

(10) Patent No.: US 6,980,462 B1
(45) Date of Patent: Dec. 27, 2005

(54) MEMORY CELL ARCHITECTURE FOR REDUCED ROUTING CONGESTION

(75) Inventors: Subramanian Ramesh, Cupertino, CA (US); Ruggero Castagnetti, Menlo Park, CA (US); Ramnath Venkatraman, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 144 days.

(21) Appl. No.: 10/715,929

(22) Filed: Nov. 18, 2003

(51) Int. Cl.[7] .............................................. G11C 11/00
(52) U.S. Cl. .................. 365/154; 365/156; 365/230.06
(58) Field of Search ............................... 365/154, 156, 365/230.05, 63, 51

(56) References Cited

U.S. PATENT DOCUMENTS 6,091,629 A * 7/2000 Osada et al. ................ 365/156

* cited by examiner

Primary Examiner—David Lam
(74) Attorney, Agent, or Firm—Kevin L. Daffer

(57) ABSTRACT

An improved memory cell architecture is provided herein for reducing, or altogether eliminating, chip-level routing congestion in System-on-Chip environments. Though only a few embodiments are provided herein, features common to the described embodiments include: the formation of bitlines in a lower-level metallization layer of the memory array, and the use of word lines and ground supply lines, both formed in inter-level metallization layer(s) of the memory array, for effective shielding of the bitlines against routing signals in the chip-level routing layer.

36 Claims, 8 Drawing Sheets

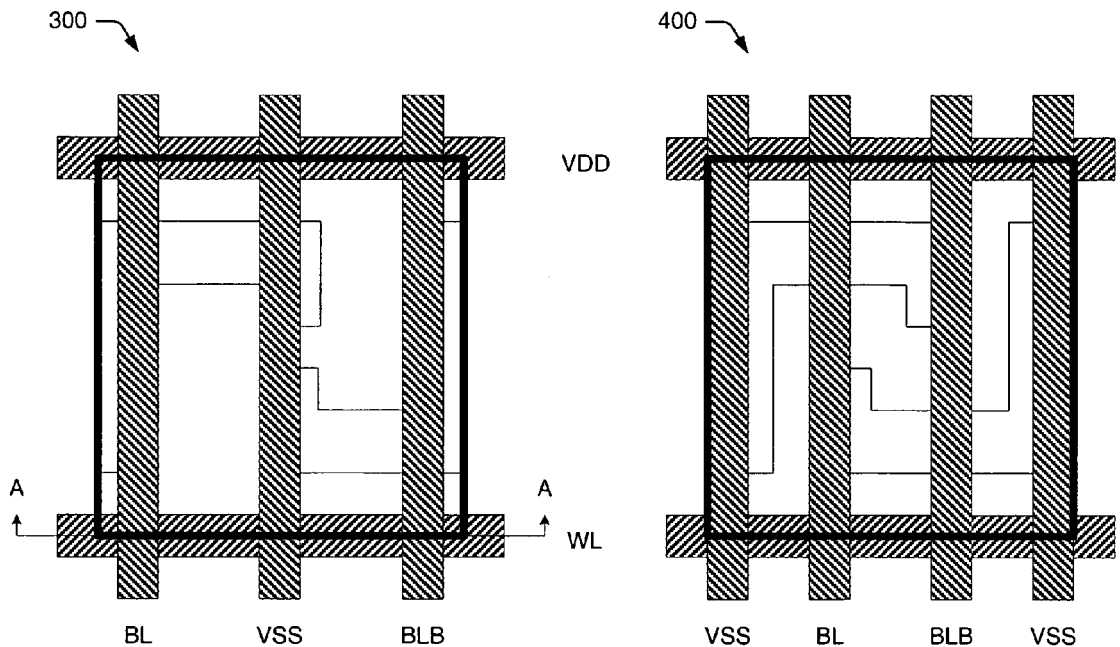
*FIG. 3*
*(Related Art)*
*FIG. 4*
*(Related Art)*
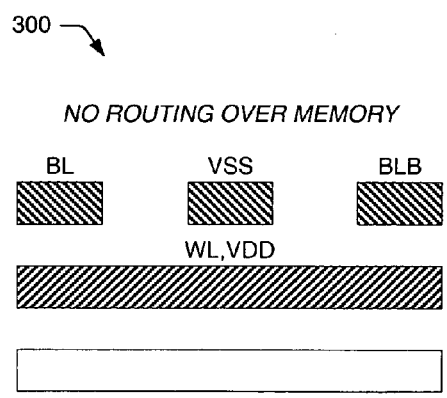
*FIG. 5*
*(Related Art)*

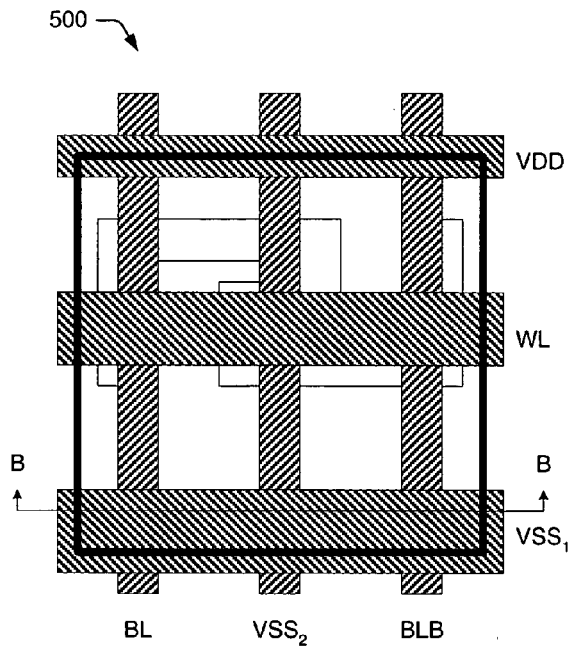
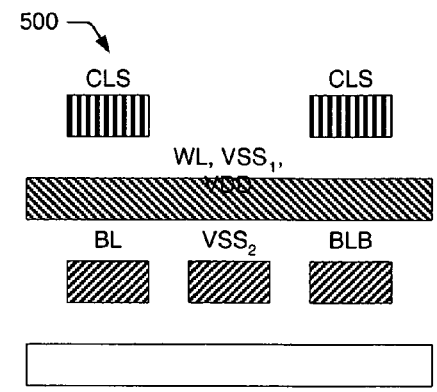
FIG. 6
FIG. 7
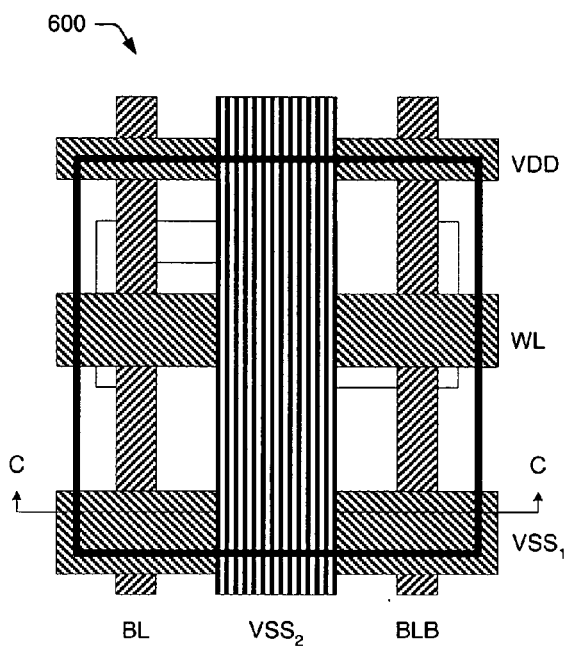
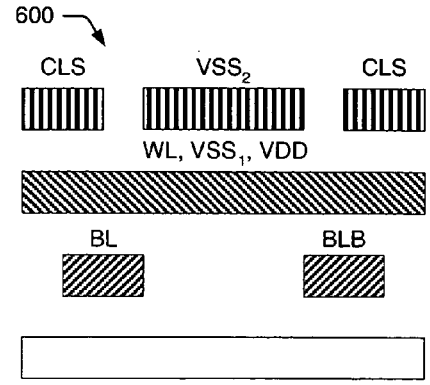
FIG. 8
FIG. 9

MEMORY CELL ARCHITECTURE FOR REDUCED ROUTING CONGESTION

BACKGROUND OF THE INVENTION

1. Field of the Invention

This invention relates to semiconductor integrated devices and, more particularly, to semiconductor memory devices having reduced routing congestion within upper level metallization layers.

2. Description of the Related Art

The following descriptions and examples are not admitted to be prior art by virtue of their inclusion within this section.

Generally speaking, system-on-chip (SoC) technology is the ability to place multiple function "subsystems" on a single semiconductor chip. The term "system-on-chip" may be used to describe many of today's complex ASICs, where many functions previously achieved by combining multiple chips on a board are now provided by one single chip. SoC technology provides the advantages of cutting development cycle time, while increasing product functionality, performance and quality. The various types of subsystems that may be integrated within the semiconductor chip include microprocessor and micro-controller cores, digital signal processors (DSPs), memory blocks, communications cores, sound and video cores, radio frequency (RF) cells, power management, and high-speed interfaces, among others. In this manner, system-on-chip technology can be used to provide customized products for a variety of applications, including low-power, wireless, networking, consumer and high-speed applications.

There are various types of semiconductor memory, including Read Only Memory (ROM) and Random Access Memory (RAM). ROM is typically used where instructions or data must not be modified, while RAM is used to store instructions or data which must not only be read, but modified. ROM is a form of non-volatile storage—i.e., the information stored in ROM persists even after power is removed from the memory. On the other hand, RAM storage is generally volatile, and must remain powered-up in order to preserve its contents.

A conventional semiconductor memory device stores information digitally, in the form of bits (i.e., binary digits). The memory is typically organized as a matrix of memory cells, each of which is capable of storing one bit. The cells of the memory matrix are accessed by wordlines and bitlines. Wordlines are usually associated with the rows of the memory matrix, and bitlines with the columns. Raising a wordline activates a given row; the bitlines are then used to read from, or write to, the corresponding cells in the currently active row. Memory cells are typically capable of assuming one of two voltage states (commonly described as "on" or "off"). Information is stored in the memory by setting each cell in the appropriate logic state. For example, to store a bit having a value of 1 in a particular cell, one would set the state of that cell to "on;" similarly, a value of 0 would be stored by setting the cell to the "off" state. (Obviously, the association of "on" with 1 and "off" with 0 is arbitrary, and could be reversed.)

The two major types of semiconductor RAM, Static Random Access Memory (SRAM) and Dynamic Random Access Memory (DRAM), differ in the manner by which their cells represent the state of a bit. In an SRAM, each memory cell includes transistor-based circuitry that implements a bistable latch. A bistable latch relies on transistor gain and positive (i.e. reinforcing) feedback to guarantee that it can only assume one of two states—"on" or "off." The latch is stable in either state (hence, the term "bistable"). It can be induced to change from one state to the other only through the application of an external stimulus; left undisturbed, it will remain in its original state indefinitely. This is just the sort of operation required for a memory circuit, since once a bit value has been written to the memory cell, it will be retained until it is deliberately changed.

In contrast to the SRAM, the memory cells of a DRAM employ a capacitor to store the "on"/"off" voltage state representing the bit. A transistor-based buffer drives the capacitor. The buffer quickly charges or discharges the capacitor to change the state of the memory cell, and is then disconnected. Ideally, the capacitor then holds the charge placed on it by the buffer and retains the stored voltage level.

DRAMs have at least two drawbacks compared to SRAMs. The first of these is that leakage currents within the semiconductor memory are unavoidable, and act to limit the length of time the memory cell capacitors can hold their charge. Consequently, DRAMs typically require a periodic refresh cycle to restore sagging capacitor voltage levels. Otherwise, the capacitive memory cells would not maintain their contents. Secondly, changing the state of a DRAM memory cell requires charging or discharging the cell capacitor. The time required to do this depends on the amount of current the transistor-based buffer can source or sink, but generally cannot be done as quickly as a bistable latch can change state. Therefore, DRAMs are typically slower than SRAMs. However, DRAMs tend to offset these disadvantages by offering higher memory cell densities, since the capacitive memory cells are intrinsically smaller than the transistor-based cells of an SRAM.

As SoC technology becomes more sophisticated, greater density, speed and performance are demanded from memory devices embedded thereon. For this reason, SRAM devices—rather than DRAM devices—are typically used in applications where speed is of primary importance, such as in communication and networking SoC applications (e.g., routers, switches and other traffic control applications). The SRAM devices most commonly used for communication and networking SoC applications are single-port devices (FIG. 1) and dual-port devices (FIG. 2), and in some cases, two-port devices (not shown).

FIG. 1 is a circuit diagram of a typical single-port SRAM memory cell 100. In general, memory cell 100 includes six transistors and uses one bi-directional port for accessing the storage element. As shown in FIG. 1, memory cell 100 utilizes a minimum of five connections; one wordline (WL) for accessing the port, two bitlines (BL/BLB) for storing the data and data complement within the storage element, one power supply line (VDD) and one ground supply line (VSS) for powering the storage element and holding the data. The storage element, or bi-stable latch, of memory cell 100 may be implemented with cross-coupled P-channel load transistors ($T1_P$ and $T2_P$) and N-channel latch transistors ($T1_N$ and $T2_N$). In an alternative embodiment, however, resistive load devices may be used in place of the P-channel load transistors, as is known in the art. A pair of N-channel access transistors (T3 and T4) provide access to the storage nodes (SN/SNB) of the bi-stable latch.

In some cases, memory cell 100 may be accessed by applying a positive voltage to the wordline (often referred to as "raising the wordline"), which activates access transistors T3 and T4. This may enable one of the two bitlines (BL/BLB) to sense the contents of the memory cell based on the voltages present at the storage nodes. For example, if storage node SN is at a high voltage (e.g., a power supply voltage, VDD) and node SNB is at a low voltage (e.g., a ground potential, VSS) when the wordline is raised, latch transistor $T2_N$ and access transistor T4 are activated to pull the bitline complement (BLB) down toward the ground potential. At the same time, the bitline (BL) is pulled up towards the power supply voltage by activation of latch transistor $T1_P$ and access transistor T3. In this manner, the state of the memory cell (either a "1" or "0") can be determined (or "read") by sensing the potential difference between bitlines BL and BLB. Conversely, writing a "1" or "0" into the memory cell can be accomplished by forcing the bitline or bitline complement to either VDD or VSS and then raising the wordline. The potentials placed on the pair of bitlines will be transferred to respective storage nodes, thereby forcing the cell into either a "1" or "0" state.

Some SoC applications benefit from the use of dual-port or two-port memory devices, which allow two independent devices (e.g., a processor and micro-controller, or two different processors) to have simultaneous read and/or write access to memory cells within the same row or column. Dual-port and two-port memory devices are essentially identical in form, and as such, can both be described in reference to FIG. 2. However, dual-port and two-port memory devices differ in function. Where both ports are used for read and write operations in a dual-port cell, one port of a two-port cell is strictly used for a write operation, while the other port of a two-port cell is strictly used for a read operation.

FIG. 2 is a circuit diagram of a typical dual-port SRAM memory cell 200, which utilizes a pair of bi-directional ports—referred to as "port A" and "port B"—for accessing the storage element. As shown in FIG. 2, memory cell 200 utilizes eight connections, including one wordline ($WL_A$/$WL_B$) for accessing each port and two pairs of bitlines ($BL_A$/$BLB_A$ and $BL_B$/$BLB_B$) for reading/writing to the nodes of the storage element, as well as, a power supply line (VDD) and ground supply line (VSS). In addition to the six transistors described above for single-port memory cell 100, a second pair of N-channel access transistors (T5 and T6) are included within dual-port memory cell 200 for accessing storage nodes SN and SNB via the additional port.

Like most semiconductor devices, SRAM devices are typically fabricated en masse on semiconductor wafers over numerous processing steps. For example, an SRAM device may be fabricated as a metal-oxide-semiconductor (MOS) integrated circuit, in which a gate dielectric, typically formed from silicon dioxide (or "oxide"), is formed on a semiconductor substrate that is doped with either n-type or p-type impurities. Conductive regions and layers of the device may also be isolated from one another by an inter-level dielectric. For each MOS field effect transistor (MOSFET) within the SRAM device, a gate conductor is formed over the gate dielectric, and dopant impurities are introduced into the substrate to form "source" and "drain" regions. Frequently, the integrated circuit will employ a conductive layer to provide a local interconnect function between the transistors and other components of the device, such as overlying bitlines, wordlines, power and ground supply lines.

A pervasive trend in modern integrated circuit manufacture is to produce transistors that are as fast as possible, and thus, have feature sizes as small as possible. Many modern day processes employ features, such as gate conductors and interconnects, which have less than 1.0 $\mu$m critical dimension. As feature sizes decrease, sizes of the resulting transistor and interconnects between transistors decrease. Fabrication of smaller transistors may allow more transistors to be placed on a single monolithic substrate, thereby allowing relatively large circuit systems to be incorporated onto a single, relatively small semiconductor chip.

As transistor feature sizes continue to decrease with advancements in manufacturing processes, greater amounts of memory may be incorporated onto the chip without increasing the chip area. This may be especially advantageous in many SoC applications, where the demand for on-chip memory is expected to increase from about 50% to about 90% of the total chip area. In an effort to effectively utilize chip area, many SoC designs divide the memory device into numerous memory blocks, which are then embedded at various locations within the chip, rather than concentrated in one large memory unit. Unfortunately, many of these SoC designs suffer from data corruption, which may be caused by stray capacitances from chip-level signals routed over the memory blocks. Though strict routing restrictions may be imposed to avoid data corruption, such restrictions often lead to chip-level routing congestion and undesirable increases in overall chip area. Therefore, a need exists for an improved memory cell architecture, which significantly decreases memory device area and chip-level routing congestion, while maintaining performance and speed specifications for next-generation SoC applications.

SUMMARY OF THE INVENTION

The problems outlined above may be in large part addressed by an improved memory cell architecture capable of reducing, or altogether eliminating, chip-level routing congestion in System-on-Chip environments. Though only a few embodiments are provided herein, features common to the described embodiments include: the formation of bitlines in a lower-level metallization layer of the memory array, and the use of word lines and ground supply lines, both formed in inter-level metallization layer(s) of the memory array, for effective shielding of the bitlines against routing signals in an upper-level metallization layer.

As used herein, the term "lower-level metallization layer" may refer to the "first metal layer" of the memory array and/or to the "second metal layer" of the memory array (e.g., when local interconnects are formed within the first metal layer as a distinct process layer). As used herein, the term "inter-level metallization layer" refers to any metal layer formed above the lower-level metallization layer(s) and included within memory array. As used herein, the term "upper-level metallization layer" refers to any metal layer formed above the inter-level metallization layer(s), but not included within the memory array.

In one embodiment, a memory cell includes a pair of complementary bitlines arranged along a first direction of the memory cell, and a wordline arranged above the pair of complementary bitlines along a second direction of the memory cell. In most cases, the second direction is substantially perpendicular to the first direction. The memory cell may also include a first global ground supply line arranged above the pair of complementary bitlines along the second direction. A second global ground supply line either coupled to, or within, the memory cell may be arranged along the first direction.

In some cases, the memory cell is comprised of a first metal layer and a second metal layer, where the second metal layer is arranged above the first metal layer. In such a case, the first metal layer may include the complementary pair of bitlines, the second global ground supply line and a local interconnect line. The second metal layer may include the first global ground supply line and the wordline.

In some cases, the memory cell may further comprise a third metal layer, where the third metal layer is arranged above the second metal layer. In such a case, the first metal layer may include a local interconnect line, the second metal layer may include the pair of complementary bitlines and the second global ground supply line, and the third metal layer may include the wordline. In some cases, the third metal layer may also include the first global ground supply line. In other cases, however, the first global ground supply line may be included within a fourth metal layer arranged above the third metal layer.

In any case, the intrinsic capacitance of the bitlines may be minimized by forming the bitlines within the lowest metal layer (e.g., the first or second metal layer) available within the memory cell. In some cases, the lowest metal layer may be dependent on the type of memory cell, as well as the process technology used to fabricate the memory cell. A significant improvement in speed and performance is attained by forming the bitlines within the lowest available metal layer of the memory cell.

The memory cell described thus far may be a single-port memory cell, and more specifically, a single-port SRAM cell. In some cases, however, the memory cell described above may include an additional pair of complementary bitlines formed within the second metal layer and arranged along the first direction, and an additional wordline formed within the third metal layer and arranged along the second direction. Thus, the memory cell may be a dual-port memory cell, and more specifically, a dual-port SRAM cell.

In another embodiment, a memory array may include a plurality of bitlines traversing the memory array in a first direction, and a plurality of word lines arranged above the plurality of bitlines and traversing the memory array in a second direction. In most cases, the second direction is substantially perpendicular to the first direction. The memory array may also include a first plurality of global ground supply lines arranged above the plurality of bitlines and traversing the memory array in the second direction. A second plurality of global ground supply lines traversing the memory array in the first direction may be coupled to, or within, the memory array.

In some cases, the memory array consists of a first metal layer, a second metal layer arranged above the first metal layer, and a third metal layer arranged above the second metal layer. The first metal layer may include a plurality of local interconnect lines, the second metal layer may include the plurality of bitlines, and the third metal layer may include the plurality of wordlines and the first plurality of global ground supply lines. A fourth metal layer may be coupled to the memory array above the third metal layer.

In one configuration of the memory array, the second plurality of global ground supply lines may be formed within the second metal layer. Such a configuration may substantially eliminate routing congestion within the fourth metal layer, while minimizing voltage fluctuations on a selected one of the first plurality of global ground supply lines (i.e., the $VSS_1$ line associated with an asserted row during a read operation). Such a configuration may also provide horizontal shielding between bitlines of dissimilar ports, if the memory array comprises memory cells with more than one port.

In another configuration of the memory array, the second plurality of global ground supply lines may be formed within the fourth metal layer. Such a configuration may reduce routing congestion within the fourth metal layer, while minimizing voltage fluctuations on the selected one of the first plurality of global ground supply lines. Such a configuration may also minimize an amount of area consumed by the memory array.

In yet another embodiment, a system embedded within and/or arranged upon a single semiconductor chip may include a memory array and one or more subsystems. The memory array may be similar to the above-mentioned memory array, and as such, may include a plurality of bitlines, a plurality of wordlines and a first plurality of global ground supply lines ($VSS_1$). The first plurality of ground supply lines may be substantially perpendicular to the plurality of bitlines.

In some cases, the plurality of wordlines and the first plurality of global ground supply lines may be formed within different metallization layers of the system. In other cases, the plurality of wordlines may be formed, along with the first plurality of global ground supply lines, within an inter-level metallization layer of the system. Regardless, the plurality of wordlines and the first plurality of global ground supply lines may be used to provide vertical capacitive shielding between the plurality of bitlines and a plurality of transmission lines routed within an upper-level metallization layer of the system, where the upper-level metallization layer is arranged above the inter-level metallization layer. The plurality of transmission lines may be used for interconnecting the one or more subsystems and the memory array.

The memory array may further include a second plurality of global ground supply lines in order to accommodate a potentially large discharge current on the first plurality of global ground supply lines. The second plurality of ground supply lines ($VSS_2$) may be substantially parallel to the plurality of bitlines. By interconnecting one or more of the $VSS_1$ lines and $VSS_2$ lines, a two-dimensional ground supply grid may be formed to reduce, or even avoid, the undesirable effects of voltage droop, ground bounce and electromigration. In order to avoid these effects, however, the $VSS_2$ lines may be formed at a particular frequency, as described in more detail below.

In one configuration of the system, the second plurality of global ground supply lines may be formed, along with the plurality of bitlines, within a lower-level metallization layer of the system, where the lower-level metallization layer is arranged below the inter-level metallization layer. In some cases, at least one of the first plurality and at least one of the second plurality of global ground supply lines may be formed within each row of memory cells. Such a configuration may substantially eliminate routing congestion within the upper-level metallization layer, while minimizing the effects of voltage droop, ground bounce and electromigration. Such a configuration may also provide horizontal capacitive shielding between bitlines of dissimilar ports, if the memory array comprises memory cells of more than one port.

In another configuration of the system, the second plurality of global ground supply lines may be formed, along with the plurality of transmission lines, within the upper-level metallization layer of the system. In some cases, at least one of the first plurality of global ground supply lines may be formed within each row of memory cells; however, each of the second plurality of global ground supply lines may be shared by two or more rows of memory cells. In addition to the effects of voltage droop, ground bounce and electromigration, such a configuration may minimize an amount of area consumed by the system, while reducing routing congestion within the upper-level metallization layer.

BRIEF DESCRIPTION OF THE DRAWINGS

Other objects and advantages of the invention will become apparent upon reading the following detailed description and upon reference to the accompanying drawings in which:

FIG. 3 is a top view of one embodiment of a single-port SRAM memory cell;

FIG. 4 is a top view of another embodiment of a single-port SRAM memory cell;

FIG. 5 is a cross-sectional view through line AA of FIG. 3;

FIG. 6 is a top view of one embodiment of a single-port SRAM memory cell in accordance with the present invention;

FIG. 7 is a cross-sectional view through line BB of FIG. 6;

FIG. 8 is a top view of another embodiment of a single-port SRAM memory cell in accordance with the present invention;

FIG. 9 is a cross-sectional view through line CC of FIG. 8;

Figure 1:
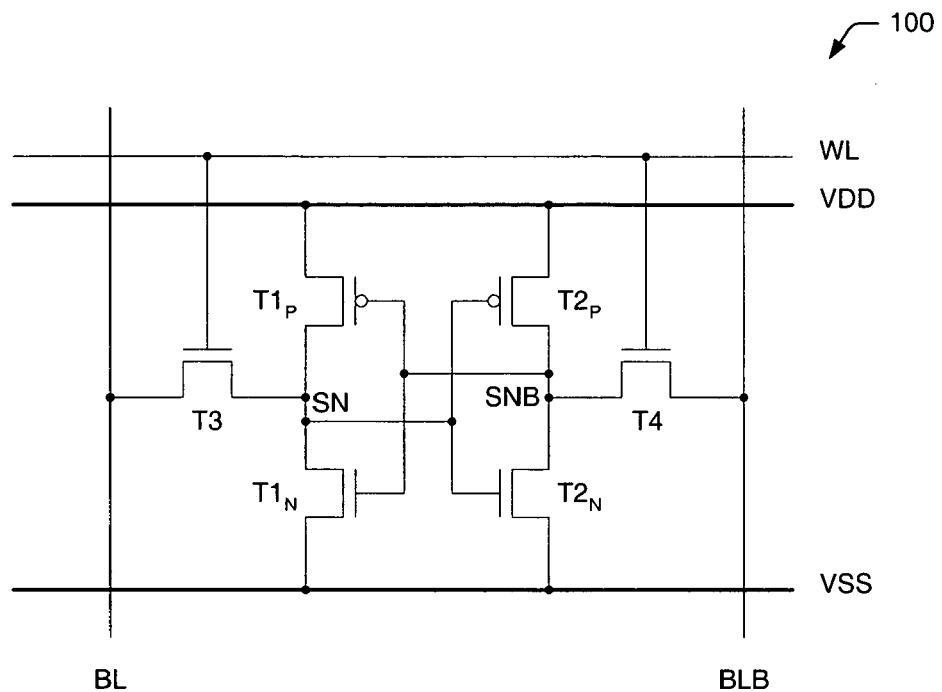
FIG. 1 is a circuit schematic diagram of a single-port SRAM memory cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIGS. 3–5 illustrate exemplary embodiments of a cell architecture that may be used to form a single-port SRAM cell, such as memory cell 100 of FIG. 1. FIGS. 3 and 4 present top-down views of cell architectures 300 and 400, respectively. FIG. 5 presents a cross-sectional view along line AA of cell architecture 300. Though the architecture of only one memory cell is illustrated in FIGS. 3–5, and later in FIGS. 6–9, one of ordinary skill in the art would understand how the architecture could be applied to an array of memory cells.

In most SRAM architectures, including those illustrated in FIGS. 3–5, the bitlines and wordlines of the memory cell run orthogonal to one another on separate metallization layers. Therefore, at least two metallization layers are needed to form an SRAM cell. In some cases, more than two metallization layers may be used in an effort to increase cell density by decreasing the cell aspect ratio. In general, the term "aspect ratio" is used herein to describe the ratio between the length and the width (denoted as L:W or W/L) of a semiconductor feature. In the case of a "cell aspect ratio," the ratio is taken between the length and width of the memory cell, where "length" is defined along the bitline direction and "width" is defined along the wordline direction. An aspect ratio of less than 1.0 is often desired to achieve higher performance, high-density SRAM architectures. By reducing the length of the memory cell (i.e., forming shorter bitlines than wordlines), the RC delay through the bitlines can be reduced to provide significantly faster memory cell addressing times than can be achieved with a memory cell having an aspect ratio of 1.0 or greater.

In some cases, three metallization layers (denoted $M_{X-1}$, $M_X$, and $M_{X+1}$) may be incorporated into the memory cell architecture, as shown in FIGS. 3–5. In some cases, the wordlines (WL) of a memory array may be formed within what is sometimes referred to as a "first metal layer." However, since the "first metal layer" typically refers to the first conductive layer above an underlying local interconnect layer, it may be a misnomer in those cases where the local interconnect layer is formed from a metallic material. To avoid confusion, the current discussion refers to the "first metal layer" as the conductive layer, which is dielectrically spaced above the various layers and/or structures forming the storage element of the memory cell (e.g., the PMOS and NMOS transistors in an SRAM cell). As used herein, the term "dielectrically spaced" refers to the formation of an interlevel dielectric layer between two conductive layers, so as to electrically isolate the two layers.

A local interconnect layer is formed within the first metal layer of FIGS. 3–5. As a result, the wordlines of FIGS. 3–5 are formed within a "second metal layer" of the memory array, where the second metal layer is dielectrically spaced above the first metal layer. In some cases, the power supply lines (VDD) of the memory array are formed parallel to, and on the same metallization layer as the wordlines. Such a case is illustrated in FIGS. 3–5. However, the VDD lines may be alternatively formed in any direction, and within any available metallization layer of the memory array.

As noted above, the bitlines (BL/BLB) of a memory array are typically formed perpendicular to, and on a different metallization layer than the wordlines. In the embodiment of FIGS. 3–5, the bitlines are formed within a "third metal layer" of the memory array, where the third metal layer is dielectrically spaced above the second metal layer. In most cases, the ground supply lines (VSS) of a memory array are formed parallel to, and on the same metallization layer as the bitlines. In some cases, one VSS line may be formed between the BL and BLB of each column of memory cells, as shown in FIGS. 3 and 5. In other cases, one VSS line may be shared between two adjacent columns of memory cells, as shown in FIG. 4. In any case, the VSS lines are typically formed in the bitline (i.e., column) direction so as to minimize the amount of current discharged to a particular VSS line during a read operation. During operation of an SRAM array, for example, all bitlines may be precharged to a logical high state until a read or write operation is conducted. When a specific address (i.e., row and column) is asserted for a read operation, all bitlines of the memory array are discharged through respective cells coupled to the asserted wordline. By forming VSS lines parallel to bitlines, as is typically the case, each VSS line carries the current of only one cell (or two cells, in the case of FIG. 4). Therefore, this approach is generally used to reduce the occurrence of voltage droop, ground bounce and electromigration effects within the memory array.

On the other hand, if the VSS lines were formed perpendicular to the bitline direction, the current from all bitlines would be discharged onto the VSS line associated with the asserted wordline. Clearly, this configuration could lead to a potentially large amount of current discharged onto a single VSS line. Assume, e.g., that an SRAM array contains 1024 columns. If VSS lines are formed perpendicular to these columns, the current of 1024 cells would be discharged onto a single VSS line. Assuming a cell current of, e.g., 50 $\mu$A, approximately 51.2 mA of current would be discharged onto the same VSS line. Thus, a relatively wide VSS line may be required to prevent voltage droop, ground bounce, or electromigration problems in the embodiment of FIGS. 3–5.

As used herein, the term "voltage droop" refers to a voltage level on a power supply line, which drops below the level applied at a certain pin as a result of the amount of current present on the power supply line and the finite resistance of that line (i.e., Ohm's Law: V=R*I). The term "ground bounce" is used when the ground plane (usually the silicon substrate) exhibits a localized voltage that is higher than the ground potential. Ground bounce can be triggered when relatively high currents are injected into the substrate. In other words, the ground potential may "float up" when the high currents injected into the substrate are not effectively sourced to ground (e.g., due to a relatively resistive ground connection). The term "electromigration" refers to the transport of material with electrical current, and in some cases, may result in a missing metal defect (i.e., open circuit) or extra metal defect (i.e., short circuit) in a conductive line. In order to avoid electromigration, guidelines are generally used to determine the maximum amount of current allowed through a conductive line, via or contact.

Unfortunately, the memory cell architectures described above and illustrated in FIGS. 3–5 suffer from many disadvantages. As features within memory cell architectures 300 and 400 are reduced (e.g., using 130 nm technology and below), chip designers are forced to move the bitlines and VSS lines to the highest metallization layer provided by the memory cell (e.g., the third metal layer, as shown in FIGS. 3–5) in order to maintain the advantages of running the VSS lines parallel to the bitlines. In some cases, additional layers of metal may be added to the memory cell to achieve necessary reductions in cell size. However, since bitline capacitance tends to increase at higher metallization layers, these methods often result in longer RC delays and slower memory cell addressing times (sometimes as much as 10% to 30% slower).

As another disadvantage, the above approach may require significant routing restrictions to be imposed on the next higher metallization layer (e.g., a fourth metal layer) to avoid data corruption during a read or write operation. In some cases, for example, the next higher metallization layer may be used for chip-level signal and power routing in a System-on-Chip (SoC) environment. If routing restrictions are not imposed in such an environment, capacitive coupling between the bitlines and overlying transmission lines (which may route chip-level signals at higher clock speeds) could disturb signal development on the bitlines, thereby corrupting data "sensed" during a read operation. For this reason, routing restrictions are usually imposed to prevent transmission lines from being routed above bitlines, as shown in FIG. 5. However, routing restrictions often lead to an undesirable increase in overall chip area (e.g., 15% to 20%), which is counterproductive to the desire for minimum cell size and maximum cell density.

Therefore, a need exists for an improved memory cell architecture that alleviates routing congestion within upper-level metallization layers (e.g., chip-level routing layers) of an SoC device, while allowing feature sizes within the memory cell to be aggressively scaled for reducing cell size and increasing cell density. Although the improvements described herein may be applied to stand-alone memory devices, the improvements are particularly applicable to SoC memory devices, due to the unique requirements (e.g., subsystem placement, timing, etc.) placed on each design.

FIGS. 6–9 illustrate exemplary embodiments of an improved memory cell architecture in accordance with the present invention. In particular, FIG. 6 presents a top-down view of cell architecture 500, while FIG. 7 presents a cross-sectional view along line BB of FIG. 6. Likewise, FIG. 8 presents a top-down view of cell architecture 600, while FIG. 9 presents a cross-sectional view along line CC of FIG. 8. Though only a few embodiments are provided for the sake of brevity, features common to the embodiments described herein include: the formation of bitlines in lower-level metallization layers, and the use of ground supply lines (VSS) for effective shielding of the bitlines against routing signals in upper-level metallization layers.

FIGS. 6–9 are used herein to describe various features of the present invention in the context of a single-port CMOS SRAM cell architecture. However, the improvements described herein are not limited to such an architecture, and may be additionally applied to: SRAM cell architectures having more than one port, SRAM cell architectures formed according to different process technologies (e.g., Silicon On Insulator, SOI), other semiconductor memory cell architectures (e.g., DRAM and various non-volatile memories, such as Ferroelectric RAM, FeRAM, or Magnetic RAM, MRAM), and other semiconductor devices (e.g., analog or mixed signal elements, and CMOS based sensor elements, such as temperature, pressure, magnetic and chemical sensors). Additional features of the present invention, which may be easier to describe in the context of a memory array—rather than a single memory cell—will be provided in the discussion of FIGS. 11–13.

For the sake of clarity, FIGS. 6–9 illustrate only the metallization layers of the memory cell. However, one of ordinary skill in the art would understand that the illustrated layers are formed above various underlying semiconductor layers and structures, such as, e.g., active regions, isolation regions, polysilicon structures, and contact structures, which may be used to form the NMOS and PMOS transistors of a typical CMOS SRAM. A preferred layout of the various underlying semiconductor layers and structures will be described in more detail in FIG. 11.

As noted above, at least two metallization layers (e.g., $M_X$ and $M_{X+1}$) are needed to form an SRAM cell. In one embodiment, the bitlines (BL/BLB) of the memory array may be formed within a "first metal layer." As used herein, the "first metal layer" refers to the first conductive layer, which is dielectrically spaced above the various layers and/or structures forming the storage element of the memory cell (e.g., the PMOS and NMOS transistors of an SRAM cell). As a result, the wordlines (WL) of the memory array may be formed within a "second metal layer" of the memory array, where the second metal layer is dielectrically spaced above the first metal layer. As noted above, the term "dielectrically spaced" refers to the formation of an interlevel dielectric layer between two conductive layers, so as to electrically isolate the two layers. This embodiment may be especially applicable to other types of memory cells, such as DRAM and MRAM cells, or larger memory cells.

In some cases, one or more local interconnects may be formed within the first metal layer, or alternatively, within an underlying process layer. Local interconnects are often used for short connections between conductive lines, as compared to the much longer conductive lines used for global connections (such as, e.g., bitlines, wordlines, power and ground supply lines). For example, local interconnects may be used for cross-coupling internal nodes of the NMOS and PMOS transistors used to form the SRAM cell. However, the term "local interconnect" may have multiple meanings.

In some cases, the term "local interconnect" may refer to the function of connecting features within a circuit. Such a definition may be used to describe a local interconnect formed within an underlying process layer, which is not considered a "local interconnect layer" even though the process layer may perform local interconnecting functions. In other cases, the term "local interconnect" may refer to a distinct process layer, i.e., a local interconnect layer, which exclusively performs short connections between conductive lines. Forming a distinct local interconnect layer may be desired in embodiments, which strive to conserve or reduce chip-level metal layers, and is commonly used in 0.25 $\mu$m process technologies and below. Regardless, the term "local" may be used herein to reference a connection that extends only partially across a memory cell, whereas the term "global" refers to a connection that extends across multiple memory cells (e.g., a block of memory cells, or an entire memory array).

In other embodiments, the bitlines of the memory array may be formed within the "second metal layer" when one or more local interconnects within the "first metal layer" form a distinct "local interconnect layer". The wordlines (WL) of the memory array may then be formed within a "third metal layer" of the memory array, where the third metal layer is dielectrically spaced above the second metal layer. Such an embodiment may be utilized in high-density SRAM arrays, due to the potential difficulty in forming bitlines and cross-coupling local interconnects within the same metal layer. On the other hand, a distinct local interconnect layer may not be needed to form other types of memory devices, such as DRAMs and MRAMs, or larger-sized memory devices (using, e.g., 0.3 $\mu$m process technologies and above).

Thus, one feature of the present invention is the formation of all bitlines within the lowest metallization layer appropriate for a particular type of memory and process technology. By forming all bitlines within the second metal layer (or lower), the intrinsic capacitance of the bitlines can be reduced to attain faster memory addressing times. By forming wordlines above the bitlines, chip-level signals (CLS) can be routed over the memory device without the risk of disturbing signal development on the bitlines during a read operation. Such an advantage will be described in more detail below.

Regardless of the layer on which they reside, the bitlines are preferably arranged along a first direction (e.g., the column direction), while the wordlines are arranged along a second direction (e.g., the row direction) of the memory array. In most cases, the second direction is substantially perpendicular to the first direction, where "substantially perpendicular" is described as an angular difference in the vicinity of 90°. However, the angular difference between the two directions may be slightly less, or slightly greater, than 90°. For example, the angular difference between the two directions may range between about 45° and about 135° (especially in the case of magnetic memory cells).

As noted above, the power supply lines (VDD) of a memory array may be formed along any direction, and within any available metallization layer of the memory array. In the embodiments of FIGS. 6–9, the VDD lines are formed parallel to the wordlines (i.e., in the second direction), and on the same metallization layer as the wordlines (i.e., within layer $M_{X+1}$). By forming the VDD lines above the bitlines, the VDD lines may also protect signal development on the bitlines during a read operation. In some cases, the VDD lines may also provide capacitive shielding between wordlines of dissimilar port, as will be described in more detail below.

In a preferred embodiment, at least a portion of the ground supply lines ($VSS_1$) are arranged along the second direction of the memory array within a metallization layer, which resides above the bitline metallization layer (i.e., layer $M_X$). In other words, at least a portion of the ground supply lines are formed substantially perpendicular to, and on a different metallization layer than the bitlines. In the embodiments of FIGS. 6–9, the $VSS_1$ lines are formed on the same metallization layer as the wordlines (i.e., layer $M_{X+1}$). In alternative embodiment, the $VSS_1$ lines may be formed on a different metallization layer than the wordlines (e.g., layer $M_{X+2}$). However, a minimum number of metallization layers is generally preferred to reduce manufacturing costs (by reducing the number of processing steps) and increase the speed of the memory device.

Thus, another feature of the present invention is the use of wordlines and ground supply lines as effective shielding of bitlines against signals routed above and/or across the memory device. For example, one or more transmission lines used for chip-level signal and power routing may be formed within an upper-level metallization layer in a System-on-Chip (SoC) environment. To ensure proper functioning of the memory array during a read operation, the wordlines and at least a portion of the ground supply lines ($VSS_1$) are formed within one or more inter-level metallization layers, i.e., one or more metal layers arranged between the bitline (lower-level) and the transmission line (upper-level) metallization layers. In this manner, the wordlines and $VSS_1$ lines provide vertical shielding between the bitlines and transmission lines, and thus, function to substantially eliminate cross-coupling capacitances therebetween. By protecting bitline signal development during read operations, the vertical shielding provided by the wordlines and $VSS_1$ lines reduces the occurrence of data corruption in the "sensed" signal. As a result, undesirable increases in chip area are avoided, since strict routing restrictions are no longer needed to ensure proper memory operation.

Because the $VSS_1$ lines are perpendicular to the bitlines of the memory array, a substantially large amount of current may be discharged onto a single $VSS_1$ line during a read operation. To accommodate this potentially large discharge current, another portion of ground supply lines ($VSS_2$) are arranged along the first direction of the memory array. In other words, another portion of the ground supply lines ($VSS_2$) may be formed substantially parallel to the bitlines of the memory array. In doing so, the adverse effects of voltage droop, ground bounce and electromigration can be reduced, or even avoided, by interconnecting one or more of the $VSS_1$ lines and $VSS_2$ lines to form a two-dimensional ground supply grid. Such a grid may be designed to the specifications of any memory array by inserting the $VSS_2$ lines at a particular frequency, as described in more detail below. Since the $VSS_1$ lines and $VSS_2$ lines are formed on different metallization layers, they may be interconnected at periodic intervals (e.g., every 8, 16, 32 . . . columns) through vias, which extend through the dielectric layer separating the corresponding metal layers.

In some cases, the $VSS_2$ lines may be formed within the same metallization layer as the bitlines (i.e., layer $M_X$), as shown in FIGS. 6 and 7. In some embodiments, N-number of $VSS_2$ lines may be inserted within every column of an N-port memory device. If the memory device includes more than one port, the $VSS_2$ lines are preferably arranged between bitlines of differing ports (e.g., between bitlines of Port A and bitlines of Port B) to provide horizontal capacitive shielding therebetween. Though it may be feasible to insert a greater or lesser number of $VSS_2$ lines within each column, it is generally preferred that the insertion frequency and/or width of the $VSS_2$ lines be chosen so as to reduce the above-mentioned effects, while avoiding unnecessary increases in memory area. For example, a $VSS_2$ lines may be inserted between multiple columns (e.g., every 4 to 64 columns, dependent on voltage restrictions) if the memory device includes only one port (i.e., a single-port memory device).

The configuration of FIGS. 6–7 may be preferred when routing congestion and/or memory speed, rather than memory device area, are of utmost concern. In other words, routing congestion within the upper-level metallization layers may be substantially eliminated by forming the $VSS_2$ lines within a lower-level metallization layer of the memory array. As a result, routing restrictions for chip-level signals in upper-level metallization layers may be altogether avoided. However, memory density may be sacrificed, to some extent, since formation of the $VSS_2$ lines within the memory array may increase the overall area consumed by the memory array. Thus, the configuration of FIGS. 6–7 produces a relatively "wide" and "short" memory cell architecture, which may be used to minimize the number of metallization layers in a memory cell (i.e., the height of the memory cell) for maximum memory speed and performance.

In other cases, the $VSS_2$ lines may be formed within a different metallization layer than the bitlines, as shown in FIGS. 8 and 9. In some embodiments, the $VSS_2$ lines may be formed within an upper-level metallization layer (e.g., layer $M_{X+2}$), which is dielectrically spaced above the memory array. For example, the upper-level metallization layer may include a plurality of transmission lines for routing chip-level signals (CLS) between various blocks of memory and one or more subsystems in a System-on-Chip environment. Though the $VSS_2$ lines may be functionally coupled to the memory array, they are not included within metal layers of the memory array in the configuration of FIGS. 8–9.

The configuration of FIGS. 8–9 may be preferred when memory device area, rather than routing congestion and memory speed, is of utmost concern. In other words, the amount of area consumed by the memory array may be significantly reduced by forming the $VSS_2$ lines above the metal layers of the memory array. Although formation of the $VSS_2$ lines within the upper-level metallization layer may somewhat limit routing through that layer, routing channels between the $VSS_2$ lines will still be available for mitigating chip-level routing congestion (e.g., by tailoring chip-level signal and power routing to comply with the requirements of the memory array). Thus, the configuration of FIGS. 8–9 produces a relatively "narrow" and "tall" memory cell architecture, which may be used to maximize memory cell density at the cost of lower memory speed and performance.

In the configuration of FIGS. 8–9, the appropriate insertion frequency and/or width of the $VSS_2$ lines can be chosen for substantially eliminating voltage droop, ground bounce, and electromigration effects without affecting memory density. For example, a $VSS_2$ line may be inserted above each column of memory cells, as illustrated in FIG. 8. Such an example would result in an insertion frequency similar to that of FIG. 6. However, the configuration of FIGS. 8–9 offers additional flexibility by routing $VSS_2$ lines above the metal layers of the memory array. This enables a $VSS_2$ line to be shared between two or more columns of memory cells, since the $VSS_2$ line can now be widened to extend across multiple columns without affecting memory density.

Figure 10:
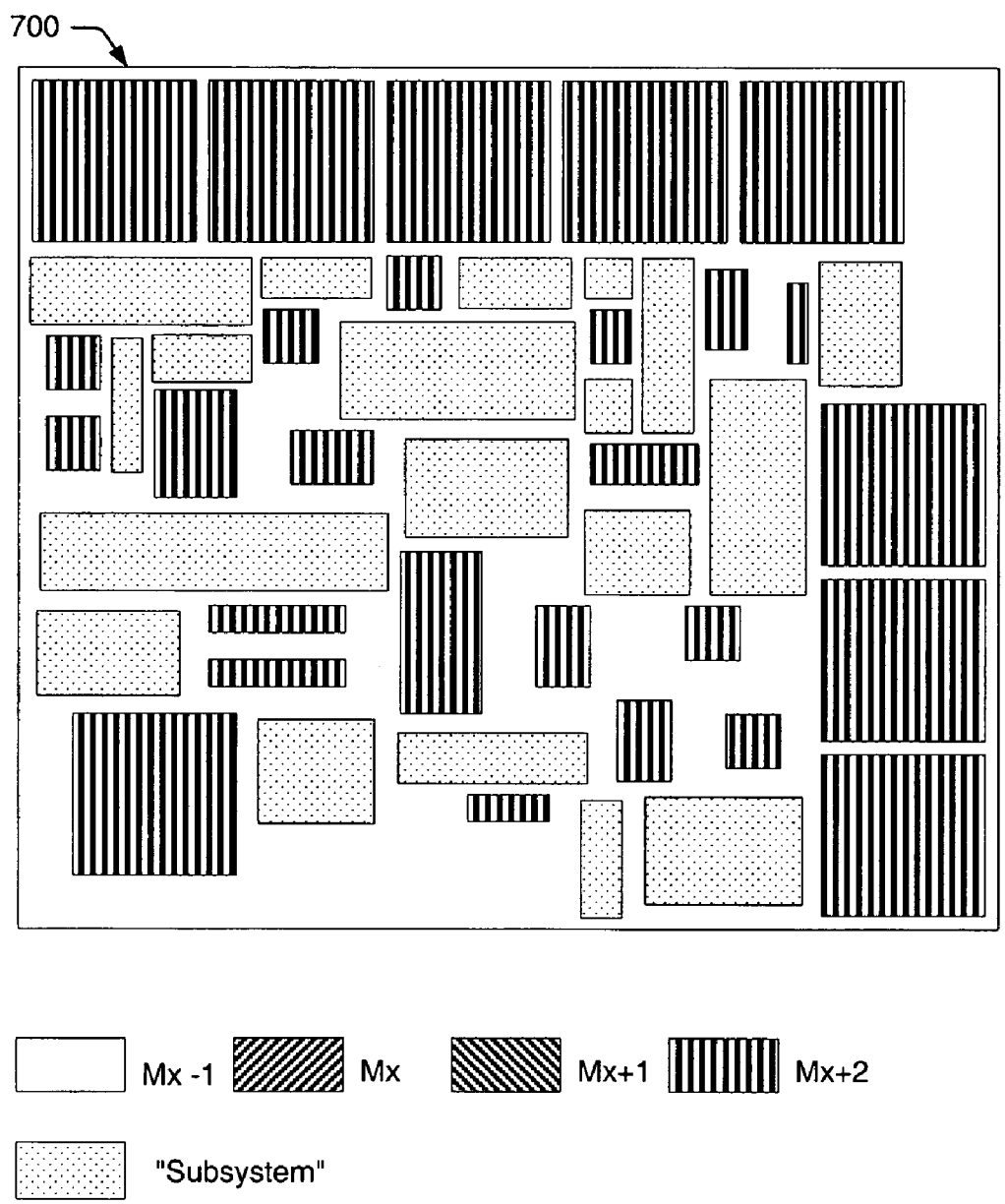
FIG. 10 is a top view of an exemplary system having various subsystems and memory blocks interconnected on an upper-level metallization layer of the system.

FIG. 10 illustrates an exemplary top-down view of a system 70 including a memory device (denoted with vertical hatch lines) and one or more subsystems (denoted with dots), all of which are embedded within and/or arranged upon a single semiconductor chip (i.e., a System-on-Chip). In an effort to effectively utilize chip area, many System-on-Chip (SoC) designs divide the memory device into numerous memory blocks. The memory blocks are embedded at various locations within the chip, rather than concentrated in one large memory unit. Substantially any number of memory blocks may be included within system 70; however, some SoC designs may require a relatively large number of memory blocks (e.g., up to 200 or more) to effectively utilize chip area. As such, the memory blocks should be constructed so as to minimize or completely avoid routing restrictions within the upper-level metallization layer, or "chip-level routing layer", of the system.

FIG. 10 illustrates the embodiment in which $VSS_2$ lines are formed within the chip-level routing layer, as described above in reference to FIGS. 8–9. Although such an embodiment may limit chip-level signal and power routing to some extent, it allows each of the individual memory blocks to be coupled to a chip-level ground supply grid. As noted above, the ground supply grid can be tailored to eliminate any voltage fluctuations (i.e., voltage droop or ground bounce) that may occur when a relatively large amount of current is discharged onto one of the ground supply lines within the memory array (i.e., a $VSS_1$ line associated with an asserted row).

Various types of subsystems may be integrated within system 70 including microprocessor and micro-controller cores, digital signal processors (DSPs), communication cores, sound and video cores, radio frequency (RF) cells, power management, and high-speed interfaces, among others. A plurality of transmission lines (not shown) may then be used for interconnecting the subsystems and/or for connecting particular subsystems to one or more memory blocks. In the current embodiment, the plurality of transmission lines (otherwise referred to as chip-level signal and power lines) are routed between the $VSS_2$ lines within the chip-level routing layer. Various types of transmission lines may be integrated within system 70 including input/output (I/O) lines, clocking lines, intra-system signal lines, and power and ground supply lines.

Several embodiments of an improved memory cell architecture have now been described in the context of a single-port SRAM cell architecture. As noted above, all bitlines are formed in the lowest available metallization layer of the memory array. Since the intrinsic capacitance of a conductive line tends to increase at higher metallization layers, the present improvement minimizes the intrinsic bitline capacitance to improve memory speed and performance. In addition, all wordlines and at least a portion of the ground supply lines are formed above the bitlines of the memory array. This also enhances memory speed and performance by enabling the wordlines and ground supply lines to vertically shield the bitlines from stray capacitances in overlying transmission lines. A two-dimensional ground supply grid is also provided for reducing the occurrence of voltage droop, ground bounce and electromigration effects in the memory array, thereby improving the robustness of the memory array.

The improvements described above are not limited to a single-port CMOS SRAM architecture, and may be additionally applied to: SRAM cell architectures having more than one port, SRAM cell architectures formed according to different process technologies (e.g., Silicon On Insulator, SOI), other semiconductor memory cell architectures (e.g., DRAM and various non-volatile memories, such as FeRAM and MRAM), and other semiconductor devices (e.g., analog or mixed signal elements, and CMOS based sensor elements, such as temperature, pressure, magnetic and chemical sensors). Additional features and improvements of the present invention will be described below in the context of a dual-port memory cell array.

Figure 11:
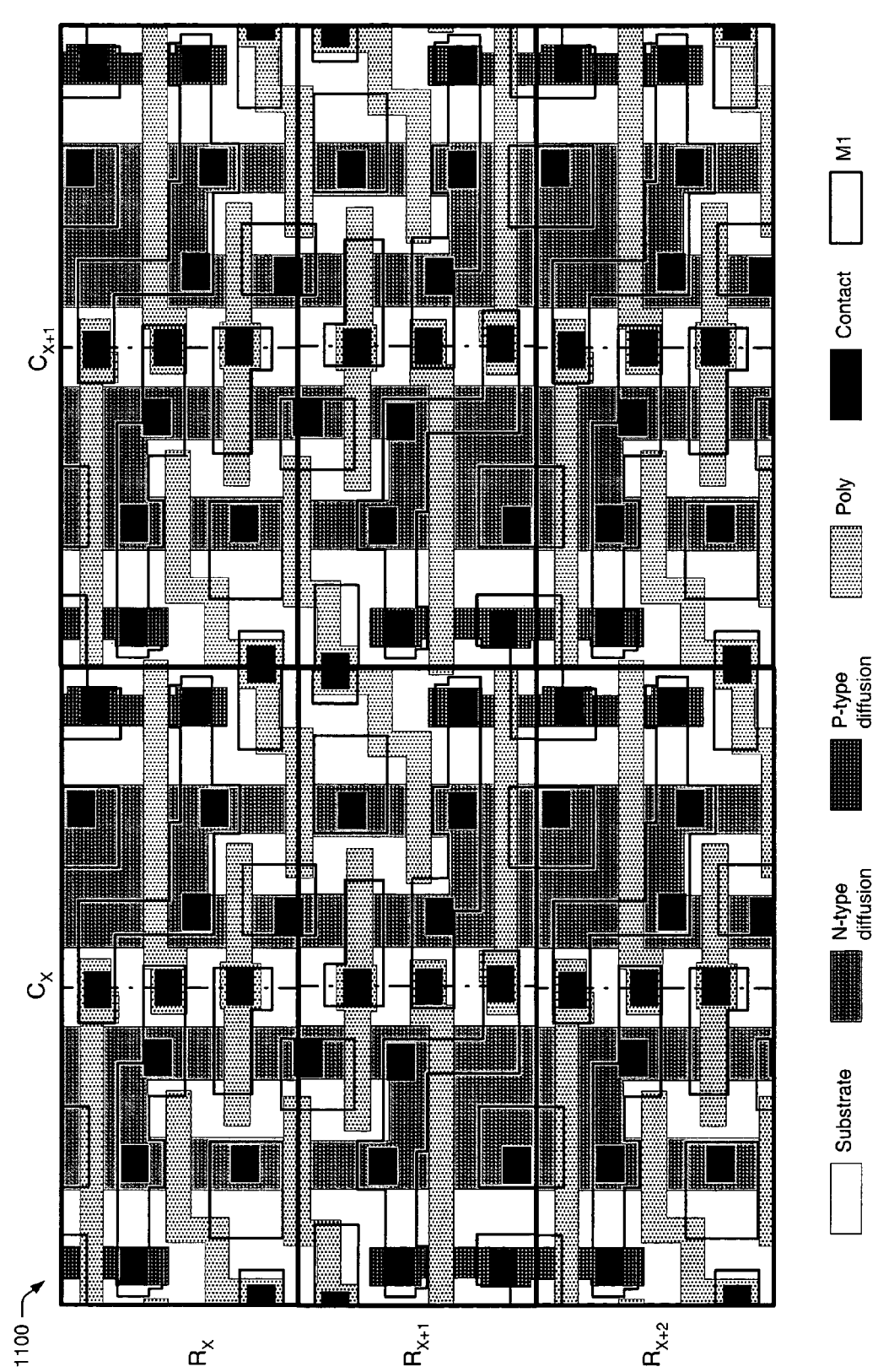
FIG. 11 is a top view of various semiconductor layers (e.g., substrate through first metal layers) within a portion of a dual-port SRAM memory array.
Figure 12:
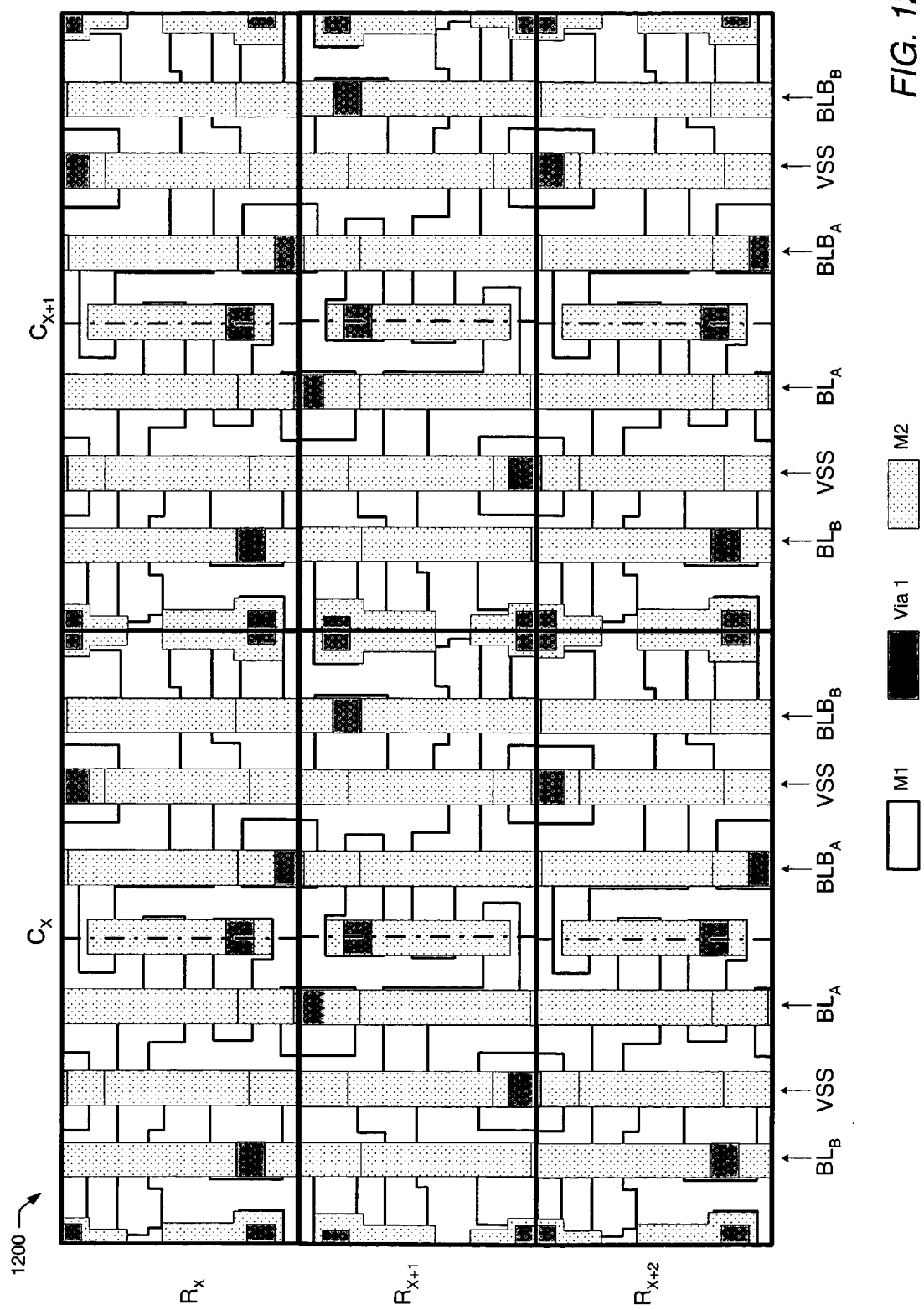
FIG. 12 is a top view of various semiconductor layers (e.g., first metal through second metal layers) within a portion of a dual-port SRAM memory array.
Figure 13:
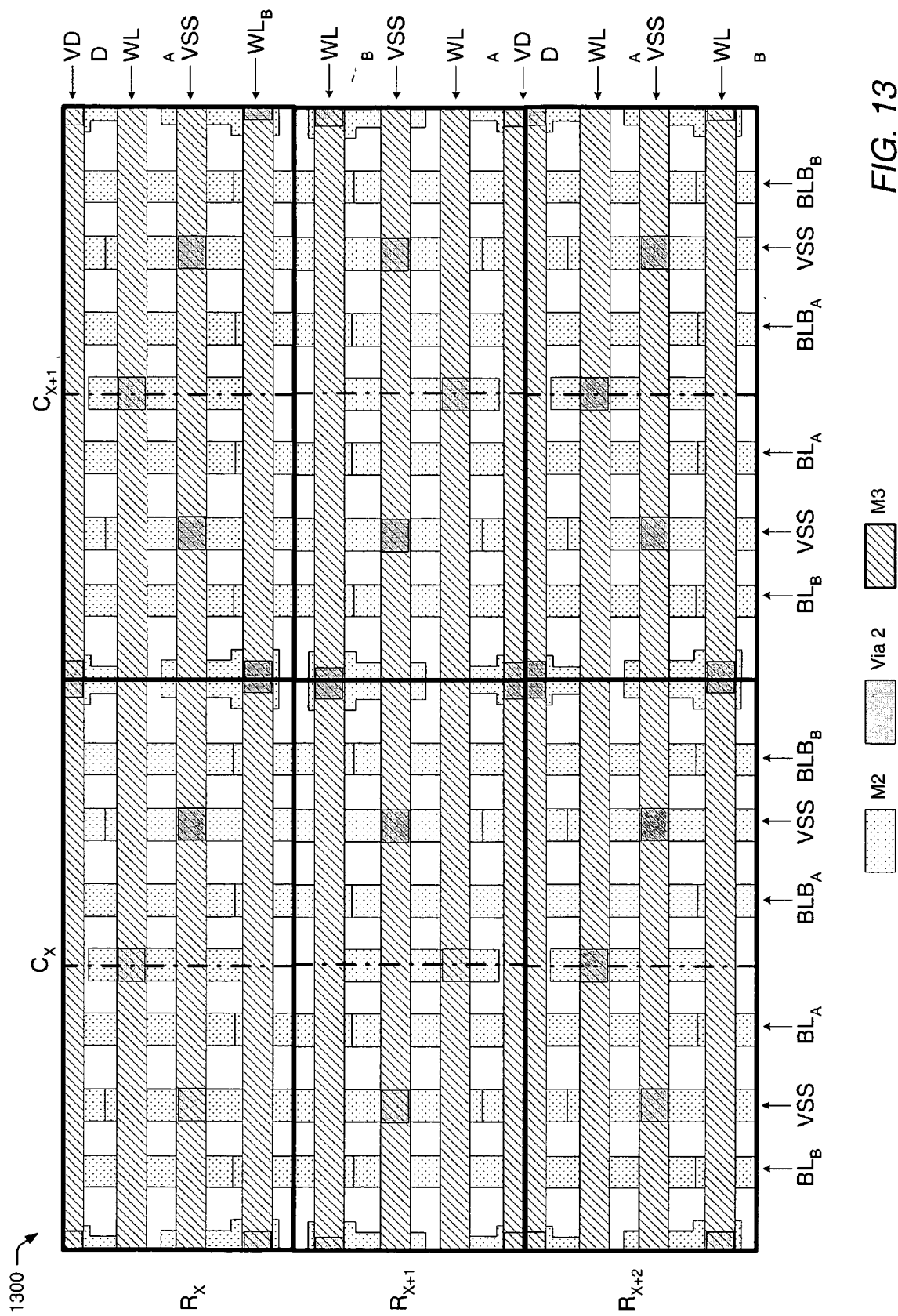
FIG. 13 is a top view of various semiconductor layers (e.g., second metal through third metal layers) within a portion of a dual-port SRAM memory array.

FIGS. 11–13 illustrate various semiconductor layers and structures that may be used to form a dual-port CMOS SRAM array. Though only a portion of the memory array is illustrated for the sake of clarity, the layout described herein may be extended to form memory arrays of substantially any size.

Figure 2:
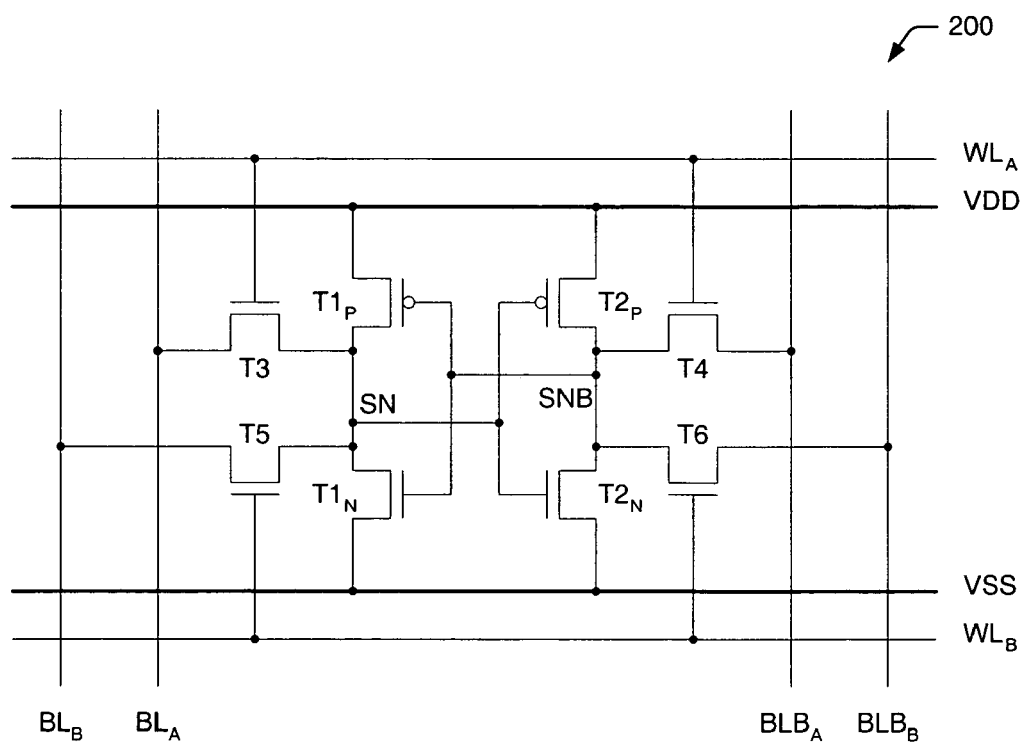
FIG. 2 is a circuit schematic diagram of a dual-port SRAM memory cell.

FIG. 11 illustrates the substrate through first metal layers of a dual-port memory array according to one preferred embodiment of the present invention. More specifically, the substrate through first metal layers of six dual-port SRAM cells—formed in three rows (denoted $R_X$, $R_{X+1}$, and $R_{X+2}$) and two columns (denoted $C_X$ and $C_{X+1}$)—are illustrated in layout 1100 of FIG. 11. Layout 1100 includes the active regions, isolation regions, gate structures and contact structures that may be used to form the NMOS and PMOS transistors of the dual-port memory cell (200) shown in FIG. 2.

The active regions, i.e., the areas where active transistors are to be formed, are embedded within a semiconductor substrate. The semiconductor substrate may be a silicon substrate doped with n-type and p-type impurities in the vicinity of the PMOS and NMOS transistors, respectively. The active regions typically include diffusion regions and isolation regions. Diffusion regions are formed within the active regions adjacent to transistor gate structures and may include, e.g., lightly doped drain regions and heavily doped source/drain regions. Dielectric isolation regions separate active regions from one another, and as such, may include field oxide regions formed by any number of techniques. The diffusion regions and isolation regions may be formed according to any method known in the art.

Each transistor includes a gate structure, which is formed above an active region, arranged between a pair of source/drain regions, and separated from the substrate by a relatively thin dielectric layer. In some cases, the gate structures may be formed from polysilicon (or "poly"), which may be deposited, e.g., by chemical vapor deposition (CVD) of silicon from a silane source, onto the thin dielectric layer overlying the substrate. Other methods of polysilicon formation are known in the art. Gate structures are not limited to polysilicon, however, and may be formed from any suitable conductive material, such as aluminum, titanium nitride, and tantalum nitride, among others. In some cases, the gate structures may include multiple layers of material, such as, e.g., a doped polysilicon and a silicide. For example, a layer of refractory metal (e.g., cobalt, nickel or titanium) may be formed upon a polysilicon layer and heated to induce a reaction between the refractory metal and the polysilicon layer. This reaction may result in the formation of a silicide, such as cobalt silicide, nickel silicide or titanium silicide.

Conductive regions and layers of the memory cell may be isolated from one another by dielectric layers. In addition to the relatively thin dielectric layer mentioned above, a relatively thick dielectric layer (not shown) may be used for isolating the gate structures from an overlying metal layer. Suitable dielectrics may include silicon dioxide ($SiO_2$), tetraorthosilicate glass (TEOS), silicon nitride ($Si_xN_y$), silicon oxynitride ($SiO_xN_y(H_z)$), and silicon dioxide/silicon nitride/silicon dioxide (ONO). The dielectrics may be grown or may be deposited by physical deposition such as sputtering or by a variety of chemical deposition methods and chemistries such as chemical vapor deposition. Additionally, the dielectrics may be undoped or may be doped (e.g., with boron, phosphorus, boron and phosphorus, or fluorine) to form a doped dielectric layer such as borophosphosilicate glass (BPSG), phosphosilicate glass (PSG), and fluorinated silicate glass (FSG).

Because the conductive regions and layers of the memory cell are isolated from one another, it is often necessary to form openings in a dielectric layer to provide access to underlying regions or layers. In general, the term "contact opening" or "contact hole" may be used to refer to an opening through a dielectric layer that exposes a diffusion region, or an opening through a dielectric layer arranged between a polysilicon structure and a local interconnect (or a first metal layer). On the other hand, an opening through a dielectric layer arranged between two metal layers may be referred to as a "via". For the purposes of this disclosure, the term "contact opening" will be used to refer to a contact opening and/or a via.

In some cases, contact openings may be filled with a conductive material to form "contact structures." The contact structures provide a pathway through which electrical signals from an overlying conductive region or layer can reach an underlying region or layer of the memory cell. Though any suitable conductive material may be used, metals (such as, e.g., aluminum (Al), copper (Cu) and tungsten (W)) are generally preferred so as to minimize the resitivity of the contact structure. Many types of contact structures (e.g., self-aligned contacts and borderless contacts) may be included within layout 1100. Although square contact structures are illustrated in layout 1100, the contact structures may be formed in any other suitable shape. As described herein, a "suitable" shape may be one that does not increase the complexity of the memory array layout.

Figure 11A:
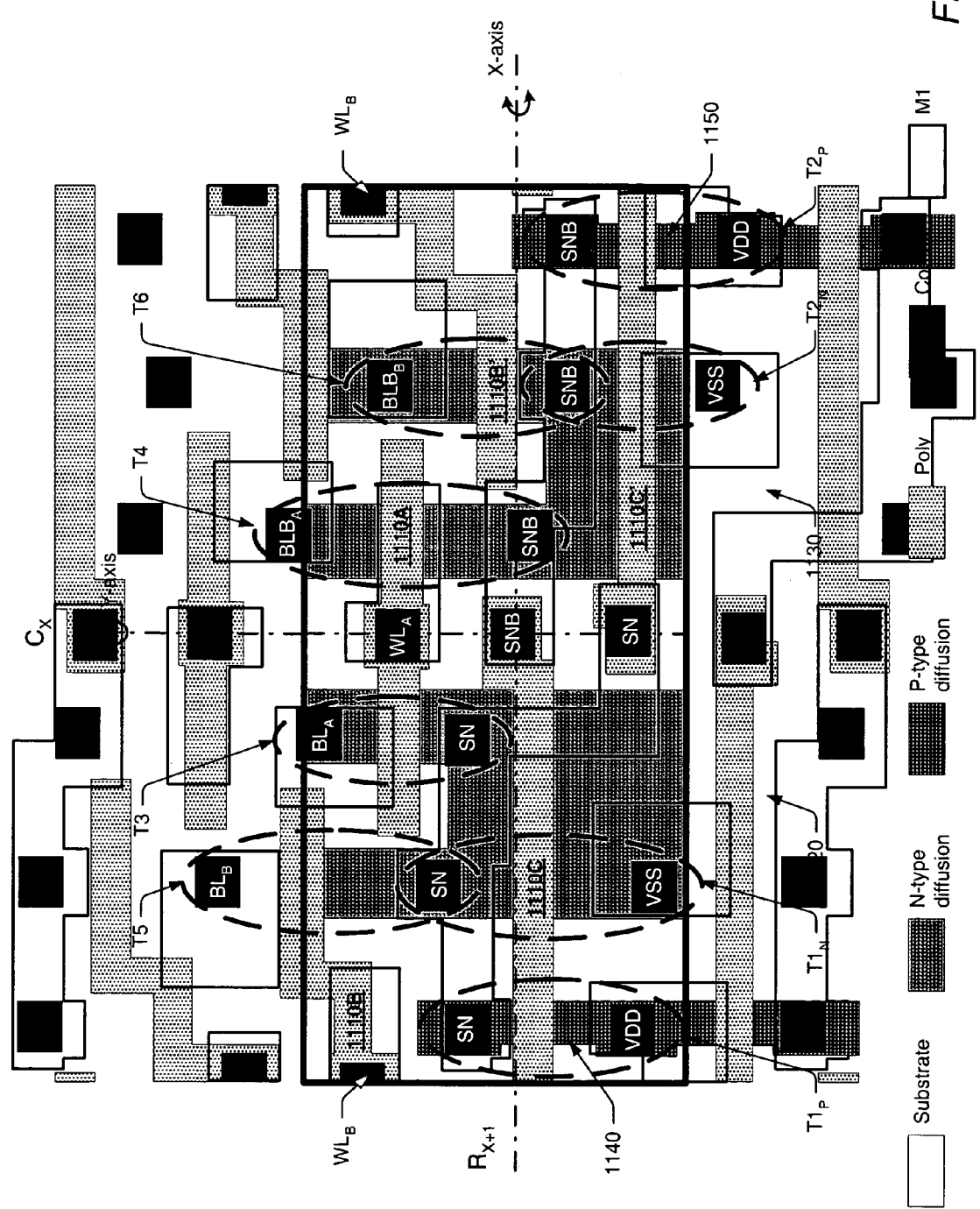
FIG. 11A is a magnified view of the memory cell located within row $R_{X+1}$, column $C_X$ of the portion shown in FIG. 11.

FIG. 11A provides a magnified view of the active regions, isolation regions, gate structures and contact structures, which may be used to form the NMOS and PMOS transistors of a dual-port memory cell. As shown in FIG. 11A, the dual-port memory cell (located within row $R_{X+1}$, column $C_X$ of layout 1100) includes two NMOS active regions and two PMOS active regions. Each of the NMOS active regions comprises a latch transistor and two access transistors. For example, polysilicon segments 1110A, 1110B and 1110C are arranged above N-type diffusion region 1120 to form the gate structures of access transistors T3, T5 and latch transistor $T1_N$. Polysilicon segments 1110A, 1110B' and 1110C' are arranged above N-type diffusion region 1130 to form the gate structures of access transistors T4, T6 and latch transistor $T2_N$. In addition, each of the PMOS active regions comprises a latch transistor. For example, polysilicon segments 1110C and 1110C' also extend across P-type diffusion regions 1140 and 1150 to form the gate structures of latch transistors $T1_P$ and $T2_P$, respectively.

As will be described in more detail below, polysilicon segment 1110A may be coupled to an overlying wordline (e.g., $WL_A$) through various contact structures and interconnects, and thus, may be referred to herein as the "first local wordline" of the memory cell. As noted above, the term "local" refers to a connection that extends only partially across a memory cell, or stated another way, a connection that does not extend completely from one side of the memory cell to the other. Polysilicon segments 1110B and 1110B' may also be coupled to an overlying wordline (e.g., $WL_B$) through various contact structures and interconnects, and thus, may be referred to herein as the "second local wordline" of the memory cell. However, segments 1110B and 1110B' may be split into distinct portions and arranged on opposite sides of the memory cell.

In one preferred embodiment, each of the first and second local wordlines are shared by two access transistors. In some cases, a local wordline may be shared by two access transistors arranged within the same memory cell. For example, the first local wordline may be shared by access transistors T3 and T4, as shown in FIG. 11A. In other cases, however, a local wordline may be shared by two access transistors arranged within different memory cells. For example, one portion of the second wordline (i.e., segment 1110B) may be shared between access transistor T5 and an NMOS access transistor within a horizontally adjacent memory cell (located, e.g., within row $R_{X+1}$, column $C_{X-1}$), as shown in FIGS. 11 and 11A. The other portion of the second wordline (i.e., segment 1110B') may be shared between access transistor T6 and an NMOS access transistor within another horizontally adjacent memory cell (located, e.g., within row $R_{X+1}$, column $C_{X+1}$). In any case, the horizontal dimension, or width, of the memory cell can be reduced by sharing the first and second local wordlines as described herein.

In another preferred embodiment, each transistor of the memory cell shares at least one contact structure with another transistor. In some cases, two or more transistors within different memory cells may utilize a "shared contact structure" for contacting a common semiconductor feature. For example, a contact structure providing access to an overlying bitline (e.g., BLB) may be shared between an access transistor of the memory cell (e.g., access transistor T5 of FIG. 11A) and an access transistor within a vertically adjacent memory cell located, e.g., within row $R_X$, column $C_X$. Similarly, a contact structure providing access to an overlying power supply line (VDD) or ground supply line (VSS) may be shared between a latch transistor of the memory cell (e.g., latch transistor $T1_N$ of FIG. 11A) and a latch transistor within another vertically adjacent memory cell located, e.g., within row $R_{X+2}$, column $C_X$. In this manner, a shared contact structure may be used to conserve space within the memory cell.

In conventional memory cell layouts, all elements of a memory cell are usually contained within a "cell pattern boundary." If a contact structure is shared between adjacent memory cells—the contact structure is usually shared at the cell pattern boundary—with substantially half of the contact structure residing on each side of the cell pattern boundary. In other words, contact structures shared between adjacent memory cells are usually symmetrically formed about the boundary between adjacent memory cells.

In contrast, the shared contact structures described herein are preferably offset from the cell pattern boundary. In other words, one or more elements of the memory cell may extend past the cell pattern boundary into an adjacent memory cell. This enables contact structures to be shared unequally between the memory cell and the adjacent memory cell. FIG. 11A illustrates several ways by which shared contact structures may be offset from the cell pattern boundary. In some cases, a shared contact structure may reside fully within the memory cell (see, e.g., the VDD, VSS and $BLB_B$ contacts of transistors $T1_P$, $T1_N$ and T6), or may reside fully within the adjacent memory cell (see, e.g., the VDD, VSS and BLB contacts of transistors $T2_P$, $T2_N$ and T5). In other cases, unequal portions of a shared contact structure may be formed within the memory cell and the adjacent memory cell (see, e.g., the $BL_A$ and $BLB_A$ contacts of transistors T3 and T4). In any case, the vertical dimension, or length, of the memory cell can be reduced (e.g., about 10% to about 20%) by offsetting the shared contact structures from the cell pattern boundary as described herein. Since bitlines are typically formed along the vertical dimension, a reduction in the vertical dimension reduces the overall bitline length to increase memory speed and memory cell density.

A simple mirroring technique may be used to incorporate the memory cell of FIG. 11A into the memory array layout of FIG. 11. For example, a column of memory cells may be formed by rotating vertically adjacent memory cells about an x-axis and about a y-axis, where the x- and y-axes extend horizontally and vertically, respectively, through a center of each memory cell. Considering that the memory cell of FIG. 11A is located within row $R_{X+1}$, column $C_X$ of layout 1100, a vertically adjacent memory cell located within either row $R_X$ or row $R_{X+2}$ of column $C_X$ would be formed by rotating a copy of the original memory cell (FIG. 11A) about its x- and y-axes before placing the rotated copy in the vertically adjacent position. In this manner, each memory cell in the column may be considered a "rotated copy" of a memory cell located directly above and/or below the rotated copy. If the memory array includes more than one column of memory cells, the original column may be reproduced at a horizontally adjacent location, thereby forming multiple rows of memory cells. As such, each memory cell in the row may be considered an "exact copy" of a memory cell located directly alongside the exact copy. The memory array layout of FIG. 11 is assembled in the design environment, so that rotation and mirroring of the individual memory cells may be performed within a software application. For a given layer, the memory array may be printed onto a reticle (along with other subsystem circuits on the chip) for subsequent transfer to a semiconductor wafer.

The above-mentioned mirroring technique enables additional features and advantages to be incorporated into layout 1100 of FIG. 11. In one embodiment, the active regions of layout 1100 are formed substantially parallel to one another; the gate structures of layout 1100 are also formed substantially parallel to one another, though perpendicular to the active regions. Since all transistors are formed in substantially the same direction, any systematic differences that may exist between perpendicularly formed transistors are eliminated by the present embodiment.

Forming all transistors in the same direction also eliminates the need for active regions that are formed perpendicular to one another and/or formed in an "L-shape." In a preferred embodiment, the N-type diffusion regions of layout 1100 are each formed as a substantially continuous line of constant width, where a "continuous line" is described as one that extends from one side of the memory array to the other. Thus, two N-type diffusion regions may be formed within each column of memory cells and shared by all NMOS transistors within that column. Though the P-type diffusion regions of layout 1100 are each formed as a substantially straight line, each P-type diffusion region extends only partially across two vertically adjacent memory cells. Thus, each P-type diffusion region may be shared by two PMOS transistors, one residing within each of the vertically adjacent memory cells. Therefore, the present embodiment may further reduce the width and length of the memory cell by avoiding complex geometries in the active regions and sharing diffusion regions between two or more vertically adjacent cells. This has the advantage of simplifying the photolithography process and reducing the memory cell density.

In another preferred embodiment, a rectangular-shaped isolation region is formed within each N-type diffusion region of layout 1100 for terminating access transistors T3–T6. For example, a distal end of the first local wordline (e.g., segment 1110A) and a distal end of one portion of the second local wordline (e.g., segment 1110B') may be terminated over one of the rectangular-shaped isolation regions. However, the first and second local wordlines are preferably formed such that their distal ends are horizontally and vertically spaced from one another. In some cases, a rectangular-shaped isolation region may be shared between two vertically adjacent memory cells, as shown in FIG. 11. Thus, the present embodiment further aids in reducing memory cell density by terminating two or more local wordlines in a staggered formation above the isolation region. This has the advantage of reducing memory cell density by reducing the width and length of the memory cell.

FIG. 12 illustrates the first through second metal layers of the dual-port memory array according to one preferred embodiment of the present invention. In general, layout 1200 includes a first metal layer and a second metal layer, which is dielectrically spaced above the first metal layer shown in phantom in layout 1100 of FIG. 11.

In some embodiments, the first metal layer may be used as a local interconnect layer for cross-coupling internal nodes of the NMOS and PMOS transistors used to form the SRAM array. The local interconnect layer may also be used for coupling overlying conductive layers to the underlying transistors. Note, however, that reference to the local interconnect layer as a "metal layer" does not limit the constituents of that layer to only metallic materials (e.g., Al and Cu). Instead, local interconnects may be fabricated from any conductive material known in the art, such as, e.g., polysilicon, doped polysilicon, refractory metal (e.g., W), silicide, or a combination of these materials.

After forming a dielectric layer (not shown) upon the first metal layer, one or more contact openings (labeled "Via1" in FIG. 12) may be etched into the dielectric layer to provide access to the first metal layer. A conductive layer may then be formed above the dielectric layer by depositing a metallic material onto the surface of the dielectric layer. After the conductive layer is patterned and etched, the conductive layer may be referred to as a "second metal layer."

In a preferred embodiment, the bitlines of the memory array are formed within the second metal layer. As mentioned above, forming all bitlines within the second metal layer (or lower) may advantageously reduce the intrinsic capacitance of the bitlines to attain faster memory addressing times. If the memory array comprises more than one port, horizontal capacitive shielding may be provided within the second metal layer between bitlines of dissimilar port.

Capacitive isolation between bitline ports may be especially important in dual-port memory arrays, which allow simultaneous read/write access to cells within the same column via Port A and Port B bitlines. For example, Port A bitlines may be used to perform a read operation on a memory cell, while Port B bitlines are simultaneously used to perform a write operation on another memory cell within the same column. Since a maximum voltage range is applied between the bitlines during the write operation, the write operation on the Port B bitlines may induce a significant charge through capacitive coupling on the Port A bitlines. Such cross-coupling may significantly slow down the read operation and/or cause errors to occur on the Port A bitlines. A similar event may occur when Port A and Port B bitlines are simultaneously used to perform separate read operations on two different memory cells within the same column; the mutual capacitive cross-coupling may slow the read operation within both ports.

In a preferred embodiment, ground supply lines ($VSS_2$) may be formed between and substantially parallel to the Port A and Port B bitlines (i.e., between $BL_A$ and $BL_B$, and between $BLB_A$ and $BLB_B$) of a multiple-port memory array to prevent inter-port capacitive coupling. Such a case is illustrated in the dual-port memory array of FIG. 12. In other cases, power supply lines (VDD) may be used to provide capacitive shielding between bitlines of dissimilar port. Thus, the present embodiment increases memory performance by inserting VSS (or VDD) lines between the Port A and Port B bitlines. Though the VSS (or VDD) lines may slightly increase the overall bitline capacitance, their inclusion between the Port A and Port B bitlines improves memory performance by significantly reducing capacitive coupling therebetween.

FIG. 13 illustrates the second through third metal layers of the dual-port memory array according to one preferred embodiment of the present invention. In general, layout 1300 includes second metal layer and a third metal layer, which is dielectrically spaced above the second metal layer shown in layout 1200 of FIG. 12. The third metal layer of the memory array may be formed in a manner similar to the formation of the second metal layer. For example, a dielectric layer (not shown) may be formed upon the second metal layer, and one or more contact openings (labeled "Via2" in FIG. 13) may be etched into the dielectric layer for accessing the second metal layer. After a metallic material is deposited onto the surface of the dielectric layer, the metallic material may be patterned and etched to form the "third metal layer".

Though non-metallic conductive materials (e.g., silicide and polysilicon) may be used to form the second and third metal layers, a metallic material is generally preferred due to the lower resitivity of metallic (e.g., about 0.2 ohms/square-unit) versus non-metallic conductive materials (e.g., about 20 to 50 ohms/square-unit). Examples of suitable metals include aluminum (Al), copper (Cu), Silver (Ag) and gold (Au). Because of their lower resitivity, metal conductors can be much longer than those of polysilicon or silicide. For this reason, metal conductors within the memory array (e.g., the bitlines, wordlines, power and ground supply lines) may extend across the entire memory array, or at least a portion thereof when the memory array is broken into numerous memory blocks.

In a preferred embodiment, the wordlines of the memory array are formed within the third metal layer. By forming wordlines above the bitlines, the wordlines function to vertically shield the bitlines from any transmission lines that may be routed over the memory array for transporting chip-level signals. The vertical shielding provided by the wordlines minimizes the adverse affects of stray capacitances from the transmission lines, thereby protecting bitline signal development during read operations and reducing the occurrence of data corruption in the "sensed" signal.

If the memory array comprises more than one port, horizontal capacitive shielding may also be provided within the third metal layer between wordlines of dissimilar port. For example, unnecessary voltage spikes may occur in at least one wordline of a dual-port memory array when the wordlines of both ports are asserted concurrently. This may cause increased leakage and/or data corruption in one or more memory cells of the array. Since the ports of a dual-port memory cell are independently operated, a situation may occur in which one of the wordlines (e.g., Port A wordline) is ramping up in voltage, while the other wordline (e.g., Port B wordline) is ramping down in voltage. In this situation, any significant capacitive coupling between the Port A and Port B wordlines can lead to a delay in "turning off" the Port B wordline and/or a delay in the WL-to-BL separation time.

In a preferred embodiment, ground supply lines ($VSS_1$) may be formed between and substantially parallel to the Port A and Port B wordlines (i.e., between $WL_A$ and $WL_B$) of a multiple-port memory array to prevent inter-port capacitive coupling. Such a case is illustrated in the dual-port memory array of FIG. 13. In other cases, power supply lines (VDD) may be used to provide capacitive shielding between wordlines of dissimilar port. Thus, the present embodiment increases memory speed and performance by inserting VSS (or VDD) lines between the Port A and Port B wordlines.

Because the $VSS_1$ lines are perpendicular to the bitlines of the memory array, however, a substantially large amount of current may be discharged onto a single $VSS_1$ line during a read operation. To accommodate this potentially large discharge current, the ground supply lines ($VSS_1$) within the third metal layer may be coupled to the ground supply lines ($VSS_2$) within the second metal layer to form a two-dimensional power supply grid. In doing so, the adverse effects of voltage droop, ground bounce and electromigration can be reduced, or even avoided, by interconnecting the $VSS_1$ and $VSS_2$ lines at an appropriate frequency. In some cases, the $VSS_1$ and $VSS_2$ lines may be coupled within each cell of the memory array. However, it may only be necessary to couple the $VSS_1$ and $VSS_2$ lines once every X-number of rows and Y-number of columns (e.g., at every row and every 8 to 32 columns), where X and Y are determined by the restrictions set for avoiding voltage droop, ground bounce and electromigration.

In one embodiment, a power supply line may be included within the memory array for every two rows of memory cells, as shown in FIG. 13. In some cases, the power supply line (VDD) line may be shared between two vertically adjacent rows by forming the VDD along the cell pattern boundary. This may further increase memory density by reducing the vertical dimension, or length, of the memory array.

It will be appreciated to those skilled in the art having the benefit of this disclosure that this invention is believed to provide an improved memory architecture offering substantial increases in memory density, speed and performance, in addition to reduced congestion in upper-level metallization layers of a system. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A memory cell, comprising:
   a pair of complementary bitlines arranged along a first direction of the memory cell;
   a first global ground supply line arranged above the pair of complementary bitlines along a second direction, which is perpendicular to the first direction; and
   wherein a second global ground supply line either coupled to, or within, the memory cell is arranged along the first direction.

2. The memory cell as recited in claim 1, further comprising a wordline arranged above the pair of complementary bitlines and along the second direction.

3. The memory cell as recited in claim 2, further comprising:
   a first metal layer; and
   a second metal layer arranged above the first metal layer.

4. The memory cell as recited in claim 3, wherein the first metal layer comprises the complementary pair of bitlines, the second global ground supply line and a local interconnect line, and wherein the second metal layer comprises the first global ground supply line and the wordline.

5. The memory cell as recited in claim 3, further comprising a third metal layer arranged above the second metal layer.

6. The memory cell as recited in claim 5, wherein the first metal layer comprises a local interconnect line, the second metal layer comprises the pair of complementary bitlines and the second global ground supply line, and the third metal layer comprises the wordline.

7. The memory cell as recited in claim 6, further comprising a fourth metal layer arranged above the third metal layer and comprising the first global ground supply line.

8. The memory cell as recited in claim 6, wherein the third metal layer further comprises the first global ground supply line.

9. The memory cell as recited in claim 8, wherein the memory cell is a single-port memory cell.

10. The memory cell as recited in claim 9, wherein the memory cell is a Static Random Access Memory (SRAM) memory cell.

11. The memory cell as recited in claim 8, further comprising:
   an additional pair of complementary bitlines formed within the second metal layer and arranged along the first direction; and
   an additional wordline formed within the third metal layer and arranged along the second direction.

12. The memory cell as recited in claim 11, wherein the memory cell is a dual-port memory cell.

13. The memory cell as recited in claim 12, wherein the memory cell is a Static Random Access Memory (SRAM) memory cell.

14. A memory array, comprising:
   a plurality of bitlines traversing the memory array in a first direction;
   a first plurality of global ground supply lines arranged above the plurality of bitlines and traversing the memory array in a second direction, which is perpendicular to the first direction; and
   a second plurality of global ground supply lines traversing the memory array in the first direction.

15. The memory array as recited in claim 14, further comprising a plurality of word lines arranged above the plurality of bitlines and traversing the memory array in the second direction.

16. The memory array as recited in claim 15, further comprising:
a first metal layer;
a second metal layer arranged above the first metal layer; and
a third metal layer arranged above the second metal layer.

17. The memory array as recited in claim 16, wherein the first metal layer comprises a plurality of local interconnect lines, the second metal layer comprises the plurality of bitlines, and the third metal layer comprises the first plurality of global ground supply lines and the plurality of word lines.

18. The memory array as recited in claim 17, wherein a fourth metal layer is coupled to the memory array above the third metal layer.

19. The memory array as recited in claim 18, wherein the second plurality of global ground supply lines are formed within the second metal layer.

20. The memory array as recited in claim 19, wherein formation of the second plurality of global ground supply lines within the second metal layer:
minimizes voltage fluctuations on a selected one of the first plurality of global ground supply lines;
substantially eliminates routing congestion within the fourth metal layer; and
provides horizontal shielding between bitlines of dissimilar ports, if the memory array comprises memory cells with more than one port.

21. The memory array as recited in claim 18, wherein the second plurality of global ground supply lines are formed within the fourth metal layer.

22. The memory array as recited in claim 21, wherein formation of the second plurality of global ground supply lines within the fourth metal layer:
minimizes voltage fluctuations on a selected one of the first plurality of global ground supply lines; and
minimizes an amount of area consumed by the memory array.

23. A system embedded within and/or arranged upon a single semiconductor chip, wherein the system comprises:
a memory array comprising a plurality of memory cells arranged in rows and columns, wherein the memory array comprises:
a plurality of bitlines arranged along a first direction of the memory array;
a first plurality of global ground supply lines arranged above the plurality of bitlines along a second direction of the memory array, wherein the second direction is perpendicular to the first direction; and
a second plurality of global ground supply lines arranged along the first direction.

24. The system as recited in claim 23, wherein the memory array further comprises a plurality of wordlines arranged above the plurality of bitlines along the second direction.

25. The system as recited in claim 24, wherein the plurality of wordlines and the first plurality of global ground supply lines are formed within different metallization layers of the system.

26. The system as recited in claim 24, wherein the plurality of wordlines are formed, along with the first plurality of global ground supply lines, within an inter-level metallization layer of the system.

27. The system as recited in claim 26, wherein the system further comprises:
one or more subsystems; and
an upper-level metallization layer arranged above the inter-level metallization layer, wherein the upper-level metallization layer comprises a plurality of transmission lines for interconnecting the one or more subsystems and the memory array.

28. The system as recited in claim 27, wherein the one or more subsystems are selected from a group comprising input/output devices, processing devices, control devices, power devices, communication devices, logic devices and additional memory arrays.

29. The system as recited in claim 27, wherein the plurality of transmission lines are selected from a group comprising input/output (I/O) lines, clocking lines, intra-system signal lines, power supply lines, and ground supply lines.

30. The system as recited in claim 27, wherein the plurality of wordlines and the first plurality of global ground supply lines provide vertical shielding between the plurality of bitlines and the plurality of transmission lines.

31. The system as recited in claim 27, wherein the second plurality of global ground supply lines are formed, along with the plurality of bitlines, within a lower-level metallization layer of the system, and wherein the lower-level metallization layer is arranged below the inter-level metallization layer.

32. The system as recited in claim 31, wherein the formation of the second plurality of global ground supply lines within the lower-level metallization layer:
minimizes voltage fluctuations caused when a relatively large discharge current is supplied to a selected one of the first plurality of global ground supply lines;
substantially eliminates routing congestion within the upper-level metallization layer; and
provides horizontal shielding between bitlines of dissimilar ports, if the plurality of memory cells comprise more than one port.

33. The system as recited in claims 31, wherein one or more of the first plurality of global ground supply lines are coupled to one or more of the second plurality of global ground supply lines to form a two-dimensional ground supply grid.

34. The system as recited in claim 33, wherein the formation of the second plurality of global ground supply lines within the upper-level metallization layer:
minimizes voltage fluctuations caused when a relatively large discharge current is supplied to a selected one of the first plurality of global ground supply lines; and
minimizes an amount of area consumed by the system.

35. The system as recited in claim 27, wherein the second plurality of global ground supply lines are formed, along with the plurality of transmission lines, within the upper-level metallization layer.

36. The system as recited in claims 35, wherein one or more of the first plurality of global ground supply lines are coupled to one or more of the second plurality of global ground supply lines to form a two-dimensional ground supply grid.

* * * * *